(12) United States Patent
Cohen et al.

(10) Patent No.: US 7,160,429 B2
(45) Date of Patent: Jan. 9, 2007

(54) ELECTROCHEMICALLY FABRICATED HERMETICALLY SEALED MICROSTRUCTURES AND METHODS OF AND APPARATUS FOR PRODUCING SUCH STRUCTURES

(75) Inventors: Adam L. Cohen, Los Angeles, CA (US); Michael S. Lockard, Lake Elizabeth, CA (US); Dennis R. Smalley, Newhall, CA (US); Vacit Arat, La Canada Flintridge, CA (US); Christopher J. Lee, Tarzana, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 10/434,103

(22) Filed: May 7, 2003

(65) Prior Publication Data

US 2004/0020782 A1 Feb. 5, 2004

Related U.S. Application Data

(60) Provisional application No. 60/430,809, filed on Dec. 3, 2002, provisional application No. 60/379,182, filed on May 7, 2002.

(51) Int. Cl.
*C25D 5/48* (2006.01)
*C25D 5/02* (2006.01)
*C25D 5/10* (2006.01)

(52) U.S. Cl. .................. 205/220; 205/118; 205/170; 205/223

(58) Field of Classification Search ................ 205/118, 205/170, 220, 223
See application file for complete search history.

(56) References Cited

U.S. PATENT DOCUMENTS

| | | | |
|---|---|---|---|
| 5,011,580 A | * | 4/1991 | Pan et al. .................... 205/118 |
| 6,027,630 A | * | 2/2000 | Cohen ......................... 205/135 |
| 2004/0028849 A1 | * | 2/2004 | Stark et al. ................. 428/34.1 |

* cited by examiner

*Primary Examiner*—Edna Wong
(74) *Attorney, Agent, or Firm*—Dennis R. Smalley

(57) ABSTRACT

In some embodiments, multilayer structures are electrochemically fabricated from at least one structural material (e.g. nickel), at least one sacrificial material (e.g. copper), and at least one sealing material (e.g. solder). In some embodiments, the layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

11 Claims, 22 Drawing Sheets

ELECTROCHEMICALLY FABRICATED HERMETICALLY SEALED MICROSTRUCTURES AND METHODS OF AND APPARATUS FOR PRODUCING SUCH STRUCTURES

RELATED APPLICATIONS

This application claims benefit of U.S. Provisional Patent Application Nos. 60/379,182, filed on May 7, 2002, and 60/430,809, filed Dec. 3, 2002 both of which are incorporated herein by reference as if set forth in full.

FIELD OF THE INVENTION

The present invention relates generally to the field of electrochemical fabrication and the associated formation of three-dimensional structures via a layer-by-layer build up of deposited materials. In particular, it relates to the formation of microstructures and the concurrent formation of packaging for such structures, such that for example, sacrificial material(s) are removed from internal cavities of the package and critical portions of the structure are sealed within the cavities.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., Apr. 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFABTM)", Chapter 19 of The MEMS Handbook, edited by Mohamed Gad-EI-Hak, CRC Press, 2002.
9. "Microfabrication—Rapid Prototyping's Killer Application", pages 1–5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A–1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D–1G. FIG. 1D shows an anode 12' separated from a mask 8' that comprises a patterned conformable material 10' and a support structure 20. FIG. 1(d) also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A–2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A–3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication can be used to form structures of complex shape using electrodepositable materials but a need exists for reliable, cost effective, and improved ways of packaging such objects or structures.

SUMMARY OF THE INVENTION

An object of various aspects of the invention is to provide improved packaging methods for critical structures.

An object of other aspects of the invention is to provide methods for concurrently fabricating structures and their packaging.

An object of still other aspects of the invention is to provide hermetically sealed structures.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

In a first aspect of the invention an electrochemical fabrication process for producing a three-dimensional structure from a plurality of adhered layers includes: (A) depositing at least a portion of a layer onto the substrate, wherein the substrate may comprise previously deposited material; and (B) forming a plurality of layers such that each successive layer is formed adjacent to and adhered to a previously deposited layer; wherein the layers comprise at least three different materials and wherein the layers contain patterns of material comprising: (1) a desired structural component that is to be protected and that is formed from at least one structural material; (2) a protective enclosure that is formed at least in part from a structural material, wherein at least one portion of the enclosure at least partially surrounds the desired structural component, and wherein the enclosure is limited by at least one opening therein; (3) a sealing material located near the at least one opening; and (4) a sacrificial material located at least partially between the desired structural component to be protected and at least a portion of the enclosure; wherein after formation of the layers at least portion of the sacrificial material located between the desired structural component and at least a portion of the enclosure is removed; and wherein after the removal of the sacrificial material, the sealing material is made to temporarily flow and seal at least one opening to block or significantly limit a passage of material from an outside of the enclosure to an inside of the enclosure via the at least one sealed opening.

In a second aspect of the invention an electrochemical fabrication process for producing a three-dimensional structure from a plurality of adhered layers, includes: (A) depositing at least a portion of a layer onto a substrate, wherein the substrate may comprise previously deposited material; and (B) forming a plurality of layers such that each successive layer is formed adjacent to and adhered to a previously deposited layer; wherein the layers comprise at least two different materials and wherein the layers contain patterns of material comprising: (1) a desired structural component that is to be protected and that is formed from at least one structural material; (2) a protective enclosure that is formed at least in part from a structural material, wherein at least one portion of the enclosure at least partially surrounds the desired structural component, and wherein the enclosure is limited by at least one opening therein; (3) a sacrificial material located at least partially between the desired structural component to be protected and at least a portion of the enclosure; wherein after formation of the layers at least portion of the sacrificial material located between the desired structural component and at least a portion of the enclosure is removed; and wherein after the removal of the sacrificial material, a seal is formed between the protective enclosure and a sealing structure wherein at least one of the protective enclosure or sealing structure comprises a sealing material that may be used in establishing a sealing of the at least one opening to block or significantly limit a passage of material from an outside of the enclosure to an inside of the enclosure via the at least one sealed opening.

In a third aspect of the invention an electrochemical fabrication process for producing a three-dimensional structure from a plurality of adhered layers includes: (A) depositing at least a portion of a layer onto a substrate, wherein the substrate may comprise previously deposited material; and (B) forming a plurality of layers such that each successive layer is formed adjacent to and adhered to a previously deposited layer; wherein the layers comprise at least two different materials and wherein the layers contain patterns of material comprising: (1) a desired structural component that is to be protected and that is formed from at least one structural material; (2) a protective enclosure that is formed at least in part from a structural material, wherein at least one portion of the enclosure at least partially surrounds the desired structural component, and wherein the enclosure is limited by at least one opening therein; (3) at least one blocking structure located along a line of sight that includes the at least one opening but spaced from the protective enclosure; and (4) a sacrificial material located at least partially between the desired structural component to be protected and at least a portion of the enclosure; (5) wherein after formation of the layers at least portion of the sacrificial material located between the desired structural component and at least a portion of the enclosure is removed; and (6) wherein after the removal of the sacrificial material, a sealing material is deposited such that it strikes said blocking material which inhibits the sealing material from entering the enclosure in bulk, where by continued build up of the sealing material seals the at least one opening to block or significantly limit a passage of material from an outside of the enclosure to an inside of the enclosure via the at least one sealed opening.

In a fourth aspect of the invention, an electrochemical fabrication process for producing a three-dimensional structure from a plurality of adhered layers includes (A) depositing at least a portion of a layer onto a substrate, wherein the substrate may comprise previously deposited material; and (B) forming a plurality of layers such that each successive layer is formed adjacent to and adhered to a previously deposited layer; wherein the layers comprise at least two different materials and wherein the layers contain patterns of material comprising: (1) a desired structural component that is to be protected and that is formed from at least one structural material; (2) a protective enclosure that is formed at least in part from a structural material, wherein at least one portion of the enclosure at least partially surrounds the desired structural component, and wherein the enclosure is limited by at least one opening therein; and (3) a sacrificial material located at least partially between the desired structural component to be protected and at least a portion of the enclosure.

Other aspects of the invention will be understood by those of skill in the art upon reviewing the teachings herein. Other aspects of the invention may involve apparatus that can be used in implementing one or more of the above method aspects of the invention. These other aspects of the invention may involve various combinations of the aspects presented above, addition of various features of one or more embodiments, as well as other configurations, structures, functional relationships, and processes that have not been specifically set forth above.

DETAILED DESCRIPTION

FIGS. 1A–1G, 2A–2F, and 3A–3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 4A:
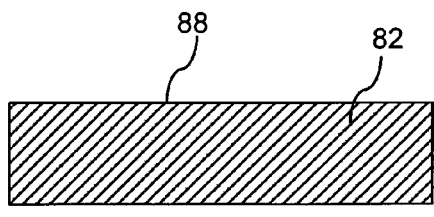
FIGS. 4A–4F schematically depict the formation of a first layer of a structure using adhered mask plating where the blanket deposition of a second material overlays both the openings between deposition locations of a first material and the first material itself.
Figure 4B:
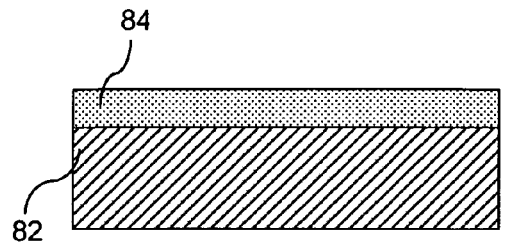
Figure 4C:
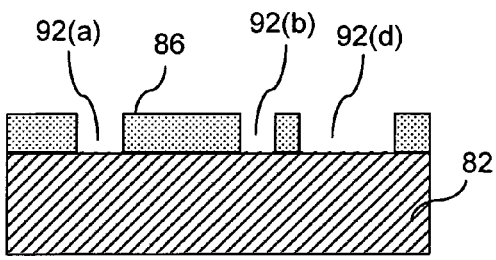
Figure 4D:
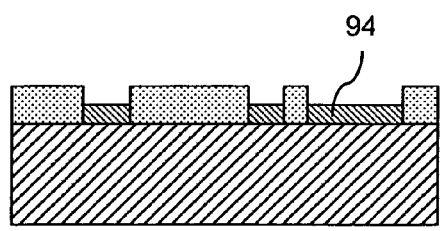
Figure 4E:
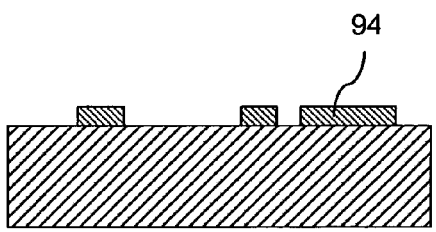
Figure 4F:
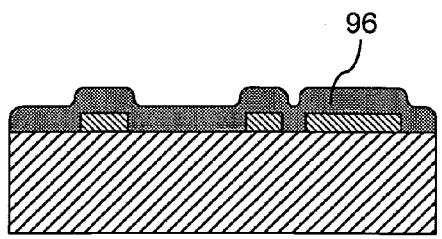
Figure 4G:
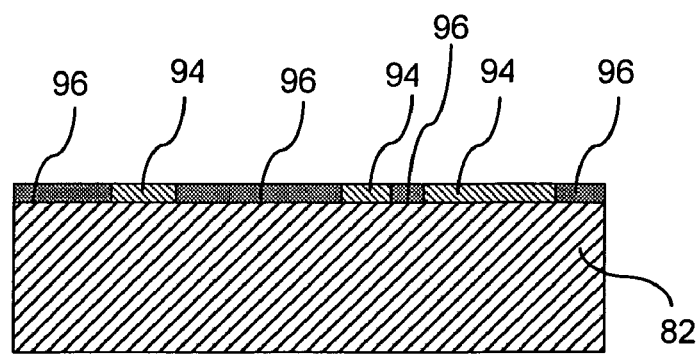
FIG. 4G depicts the completion of formation of the first layer resulting from planarizing the deposited materials to a desired level.
Figure 4H:
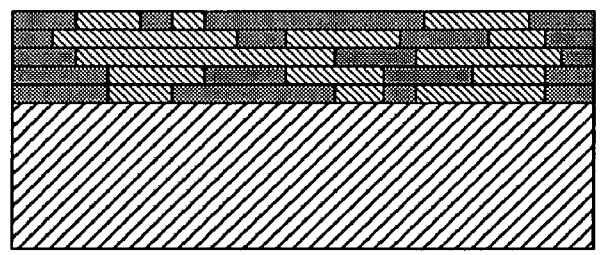
FIGS. 4H and 4I respectively depict the state of the process after formation of the multiple layers of the structure and after release of the structure from the sacrificial material).
Figure 4I:
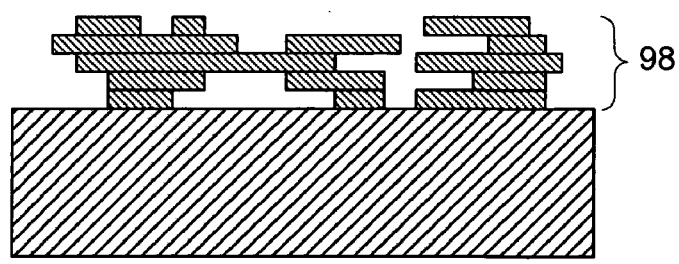

FIGS. 4A–4F illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown onto which patternable photoresist 84 is cast as shown in FIG. 4B. In FIG. 4C a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4D a metal 94 (e.g. nickel) is shown as having been electroplated into the openings 92(a)–92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B–4G several times to form a multi-layer structure is shown where each layer consists of two materials. For most applications, one of these materials is removed as shown in FIG. 4I to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

Figure 5A:
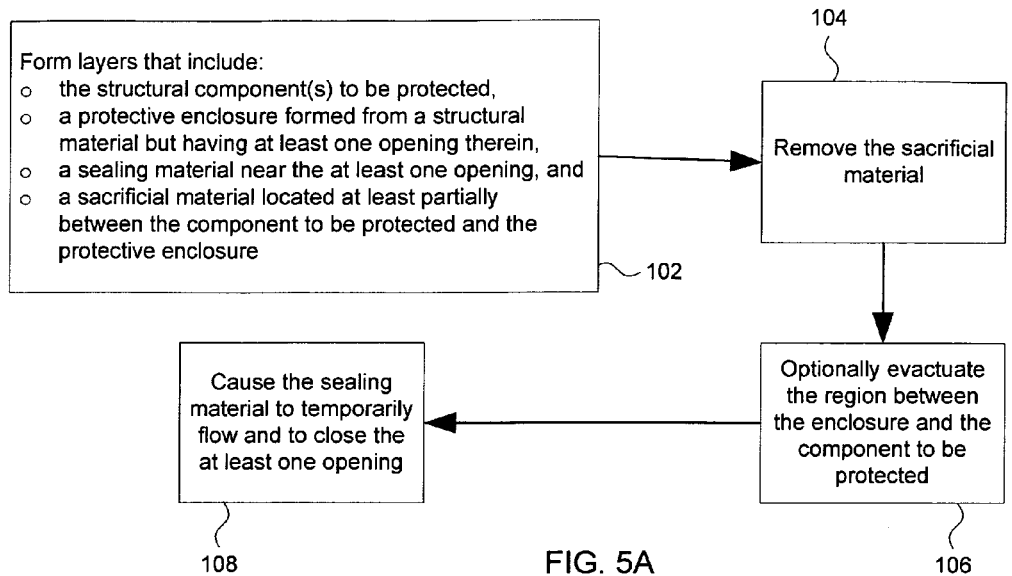
FIG. 5A depicts a block diagram of the basic steps of a first group of embodiments.

FIG. 5A presents the basic steps of a first group of embodiments of the invention in the form of a block diagram. Block 102 calls for the formation of a group of layers that include: (1) structural component(s) that are to be protected; (2) a protective enclosure formed from a structural material but having at least one opening therein; (3) a sealing material located near the at least one opening in the protective enclosure; and (4) a sacrificial material located at least partially between the component(s) to be protected and the protecting enclosure. The fabrication process used may be similar to the one illustrated in FIGS. 1A–1C and 2A–2F or it may be another process set forth in the '630 patent, a process set forth in one of the other previously incorporated publications, a process described in one of the applications that is included in the listing of incorporated patents and applications set forth hereafter, or the process may be a combination of various approaches described in these publications, patents, and applications, or otherwise known or ascertainable by those of skill in the art.

After the layers are formed the process proceeds to block 104 which calls for the removal of the sacrificial material.

Next, at block 106, the process calls for the optional evacuation of the region(s) between the enclosure and the structure to be protected. The process may also include the back filling of the regions with a desired fill gas. The fill gas, for example, may be inert (e.g. $N_2$, Ar, or the like) or it may be chemically active such as providing a reducing environment (e.g. $H_2$). The process may also include some special processing that is useful for preparing the structure/enclosure combination for the next operation.

Finally, at block 108, the sealing material is temporarily made to flow and to close the at least one opening.

Figure 5B:
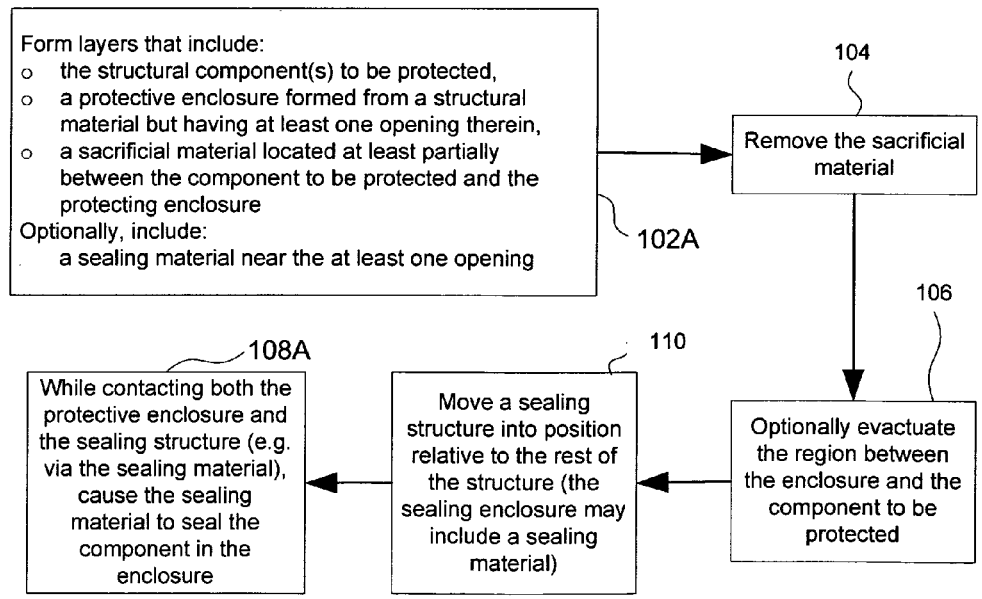
FIG. 5B presents the basic steps of a second group of embodiments in the form of a block diagram.
Figure 6A:
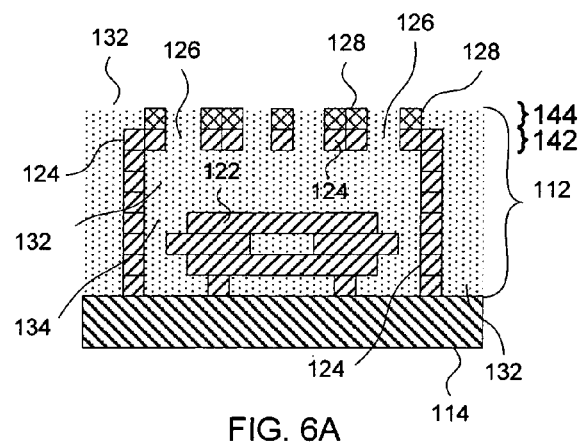
FIGS. 6A–6C depict side views of various stages in the production of a structure according to a preferred embodiment of the invention.
Figure 6B:
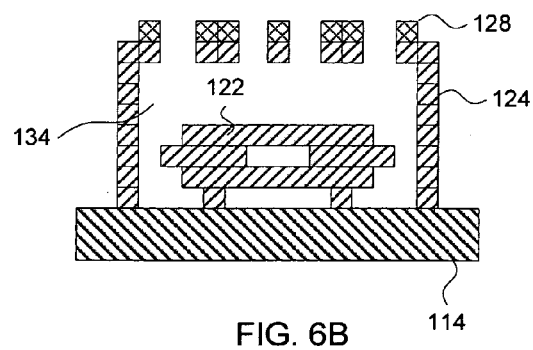
Figure 6C:
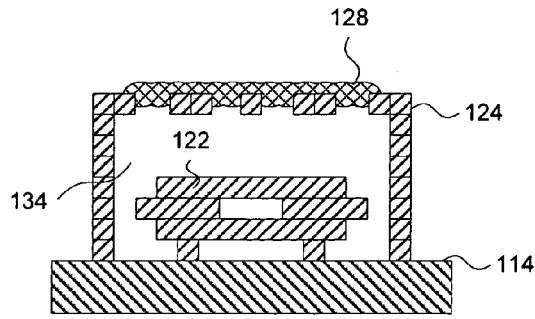

FIGS. 6A–6C present side views of various stages of the process flow of FIGS. 5A–5C as applied to a specific structure. FIG. 6A depicts the group of layers 112 electrochemically fabricated and attached to a substrate 114. The group of layers includes (1) a structural component 122 that is to be protected and formed from a structural material; (2) a protective enclosure 124 formed from a structural material but having multiple openings 126 therein; (3) a sealing material 128 located near the openings; and (4) a sacrificial material 132 that fills the interior 134 (i.e. cavity) of the enclosure 124.

FIG. 6B depicts the substrate 114, the enclosure 124, the structural component 122, and the sealing material 128 after removal of the sacrificial material but before flowing, sealing, and resolidification of the sealing material. The sacrificial material is preferably removed by etching with the etchant entering the cavity through the openings in the enclosure.

FIG. 6C depicts the substrate 114, the enclosure 124, the structural component 122, and the sealing material 128 after flowing, sealing, and resolidification of the sealing material. In this embodiment, the structural component becomes protected within the package defined by the enclosure 124 and the substrate 114. In the present embodiment the sealing material is preferably a low melting temperature electroplatable metal or solder-like material such as Indium (In) or Tin (Sn)/Lead (Pb). The sacrificial material may be copper and the structural material may be nickel, though of course other appropriate materials would be acceptable. The requirement being that the etching of the sacrificial material should not damage the structural component 122 or significantly damage the sealing material 128.

Figure 6D:
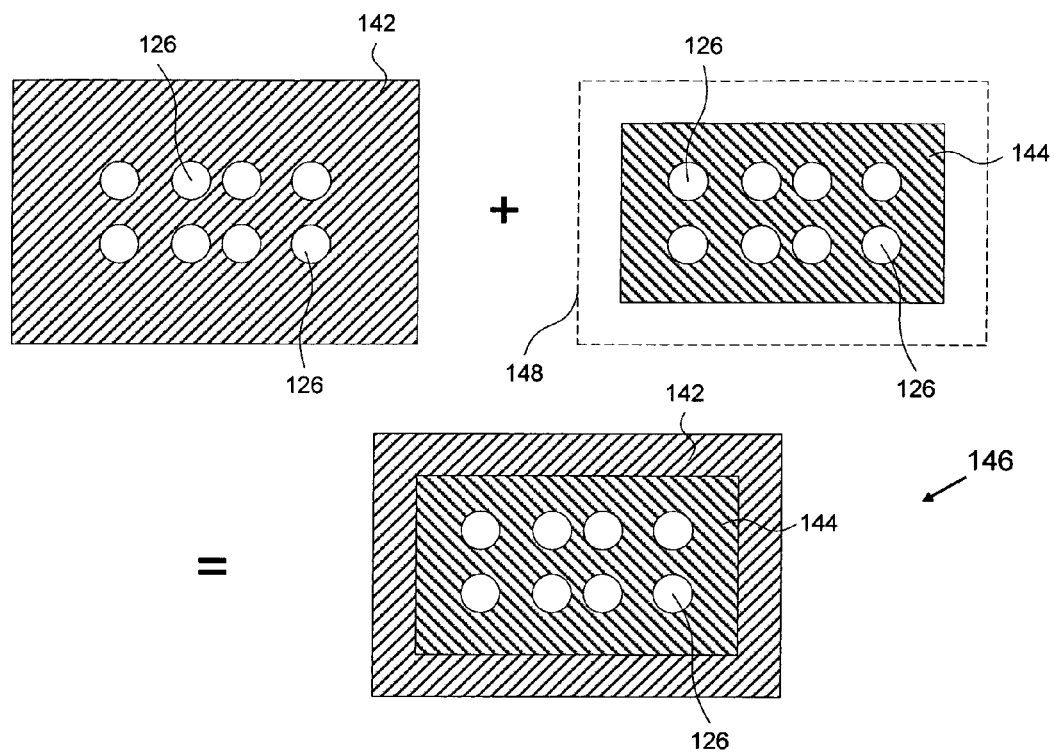
FIG. 6D depicts a top view of the upper two layers of the structure of FIG. 6B separated and then overlaid.

FIG. 6D depicts a top view of the upper most layers of FIG. 6B. The left most component 142 is the second to last layer which is the lid of enclosure 124 and which is made from the structural material and which includes openings 126. Component 144 is the last layer of the structure and is made from a sealing material 128. It also includes openings 126. Component 144 is surrounded by a dashed boundary line 148 which illustrates the outer boundary of component 142 when the two components are aligned. Component 146 shows a top view of the two components 142 and 144 overlaid with the openings 126 aligned.

Figure 7A:
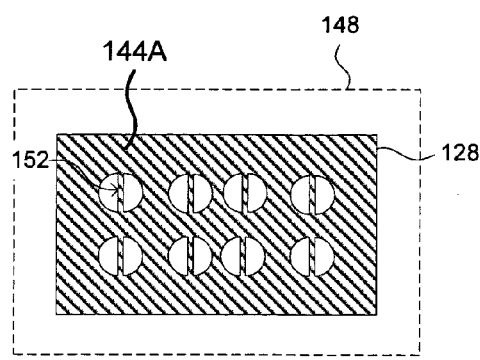
FIGS. 7A and 7B depict top views of two alternative configurations of the sealing layer of FIG. 6B
Figure 7B:
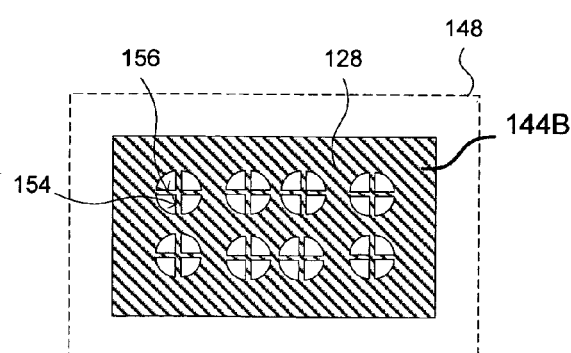

FIGS. 7A and 7B depict two alternative configurations 144A and 144B of the sealing layer 144 of FIG. 6D. In FIG. 7A the sealing material 128 include a single cross-bar 152 that bridges the openings as it is believed that such a bridge might aid in closing the opening when the sealing material is made to flow (e.g. by heating sufficiently). FIG. 7B is similar to FIG. 7A with the exception that two crossed bridging elements 154 and 156 are provided.

Figure 8A:
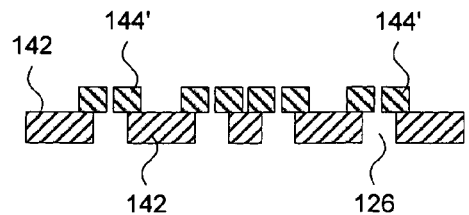
FIG. 8A depicts a side view of an alternative configuration for the final two layers of FIG. 6B while 8B depicts a top view of the upper two layers of the alternative structure first separated one from the other and then overlaid.
Figure 8B:
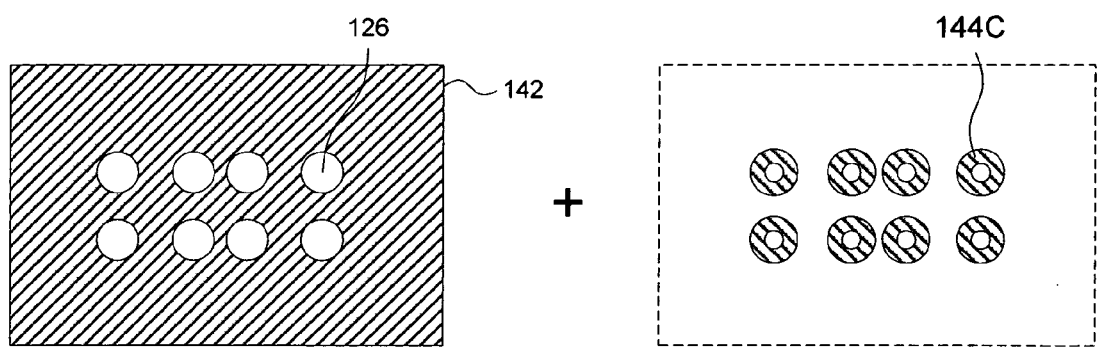
Figure 8B:
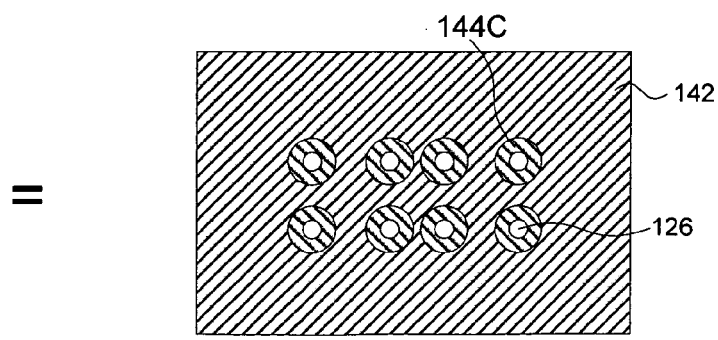

FIG. 8A depicts a side view of an alternative configuration for the final two layers of FIG. 6B while 8B depicts a top view of the structure of FIG. 8A. The second to last layer 142 has not changed its configuration from that which was depicted in FIG. 6D whereas the final layer 144C has been modified. Instead of the last layer being configured as a rectangular plate with holes in it as was the case in FIGS. 6A–6D, in FIGS. 8A and 8B the sealing material around each opening is in the form a ring as can be best seen in FIG. 8B and more particularly the rings have smaller inner diameter than do the holes 126 in layer 142. It is believed that the partial overlap of the sealing material with the holes 126 in layer 142 will aid in causing the material to fill in and seal the openings when the sealing material is made to flow.

Figure 9A:
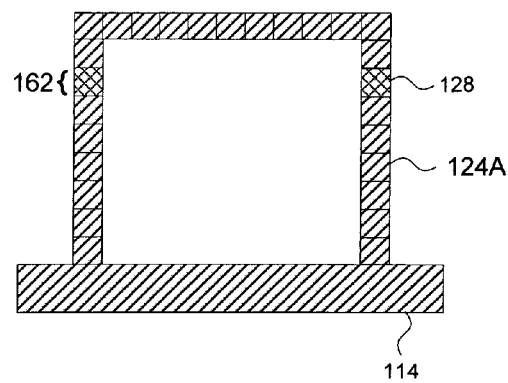
FIGS. 9A–9D depict side views and top views illustrating features of an alternative opening and sealing configuration for an enclosing wall.
Figure 9B:
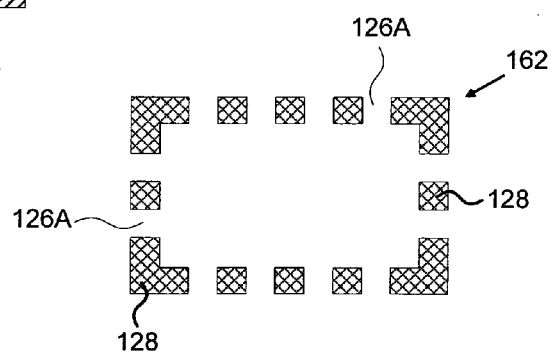
Figure 9C:
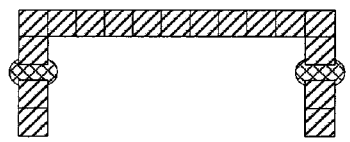
Figure 9D:
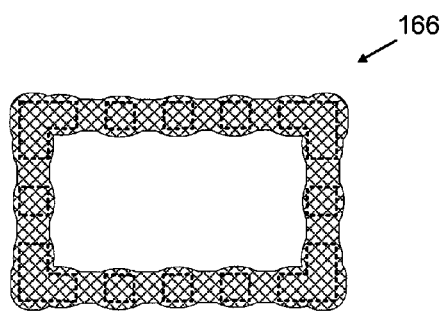

FIG. 9A depicts a side view of an enclosure 124A that is formed from a structural material with the exception of the third to last layer from the top which is a sealing material layer 162 formed of sealing material 128. The sealing material layer is shown from a top view in FIG. 9B where a plurality of openings 126A through the sealing material layer 162 can be seen. Upon flowing of the sealing material 128 it is believed that the material 128 will spread and collapse to bridge the openings and seal them. The collapse of the sealing layer can be seen in the side view of FIG. 9C. The spreading of the sealing material and the closing of the openings 126A can be seen in the top view of FIG. 9D wherein the structures with the dashed boundaries represent the original configuration of sealing material layer 128 prior to flowing while the overall structure 166 is formed from the spreading out of material 128 after flowing. In alternative embodiments, the collapse of the sealing layer and the spread of sealing material may be aided by application of a pressure or force to the upper portion of the structure.

Figure 10A:
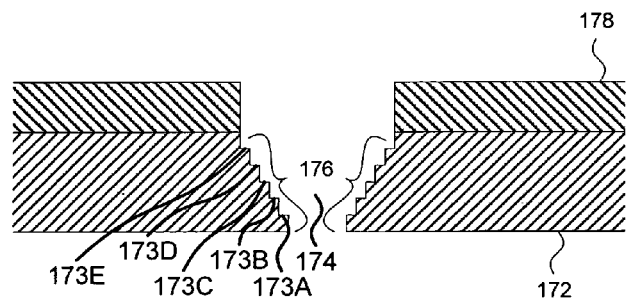
FIGS. 10A–10I depict various alternative opening and sealing configurations.
Figure 10B:
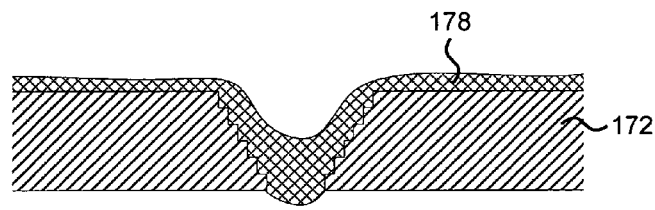

FIG. 10A depicts a thickness (e.g. one or more layers) of a portion of an enclosure made from a structural material 172 and having an opening 174 therein with sloped faces 176. A sealing material layer 178 is shown above the layer(s) of structural material 172. The sloped faces 176 are shown with stair steps 173A–173E though in some embodiments they may be more truly of a sloped configuration. It is believed that the sloping (or small stair steps) may help the flowable sealing material wet the surface of the opening 174 when the sealing material is made to flow and thus will aid in the closure of the opening. FIG. 10B shows the resulting closure of the opening of FIG. 10A after the sealing material 178 is made to flow and allowed to resolidify.

Figure 1A:
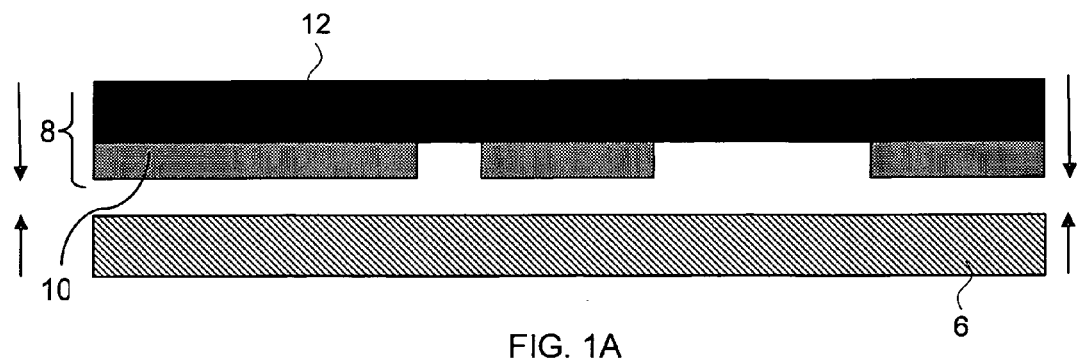
FIGS. 1A–1C schematically depict side views of various stages of a CC mask plating process, while FIGS. 1D–1G schematically depict a side views of various stages of a CC mask plating process using a different type of CC mask.
Figure 1B:
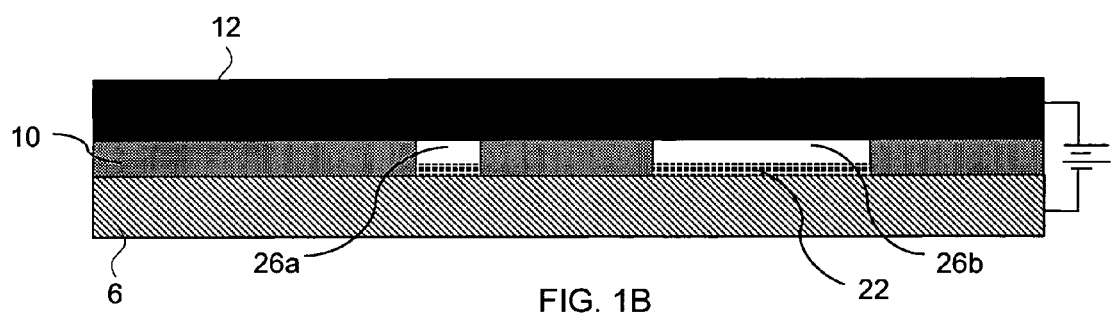
Figure 1C:
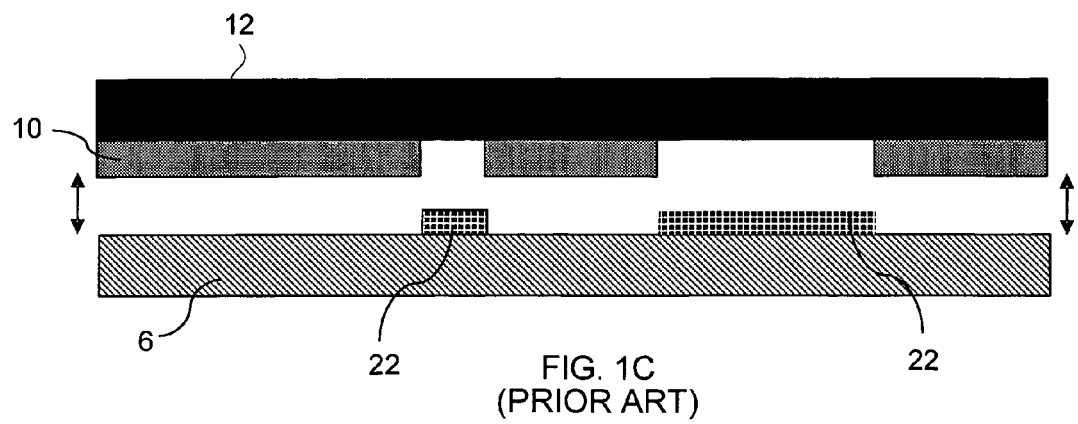
Figure 1D:
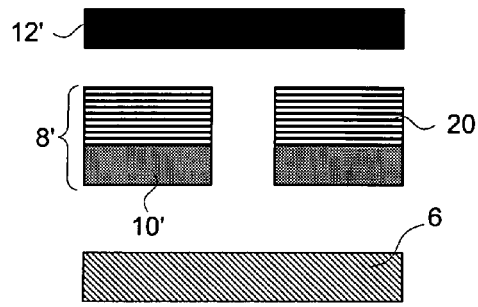
Figure 1E:
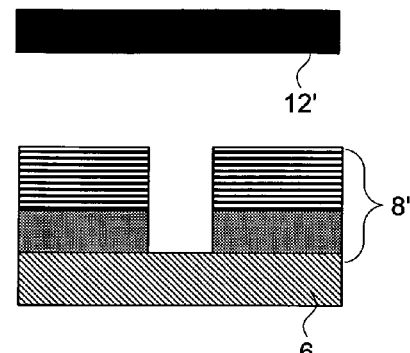
Figure 1F:
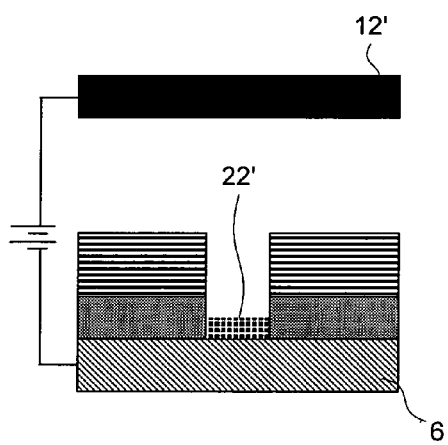
Figure 1G:
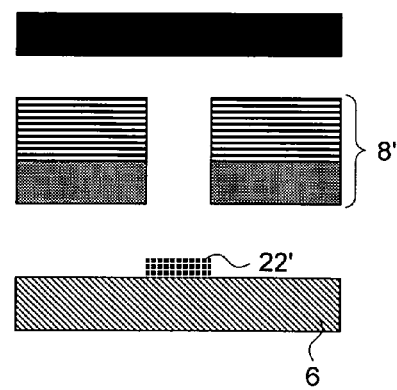
Figure 2A:
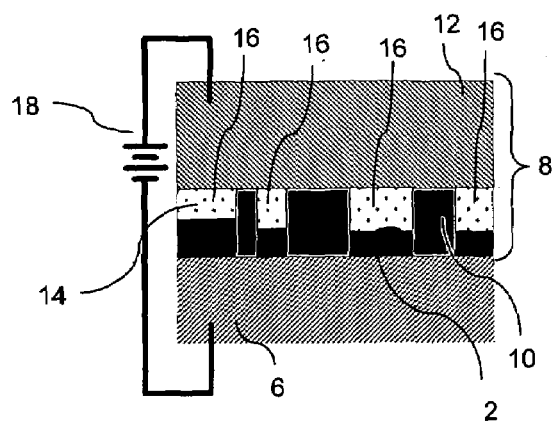
FIGS. 2A–2F schematically depict side views of various stages of an electrochemical fabrication process as applied to the formation of a particular structure where a sacrificial material is selectively deposited while a structural material is blanket deposited.
Figure 2B:
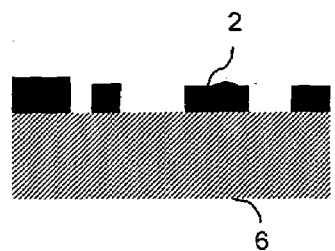
Figure 2C:
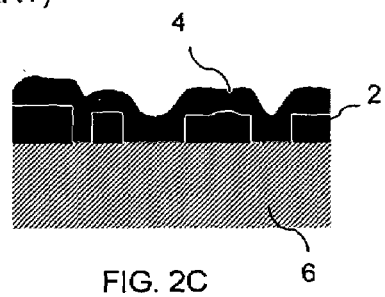
Figure 2D:
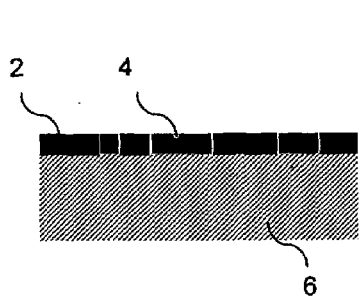
Figure 2E:
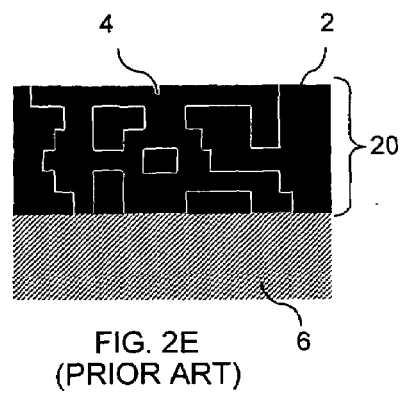
Figure 2F:
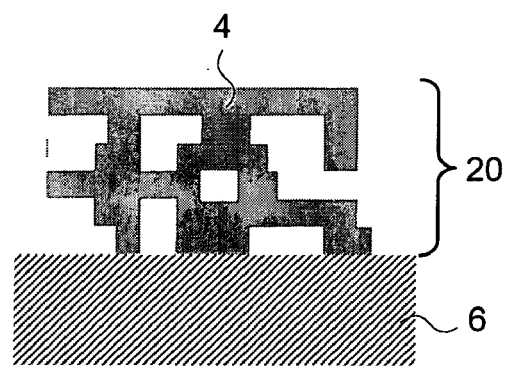
Figure 3A:
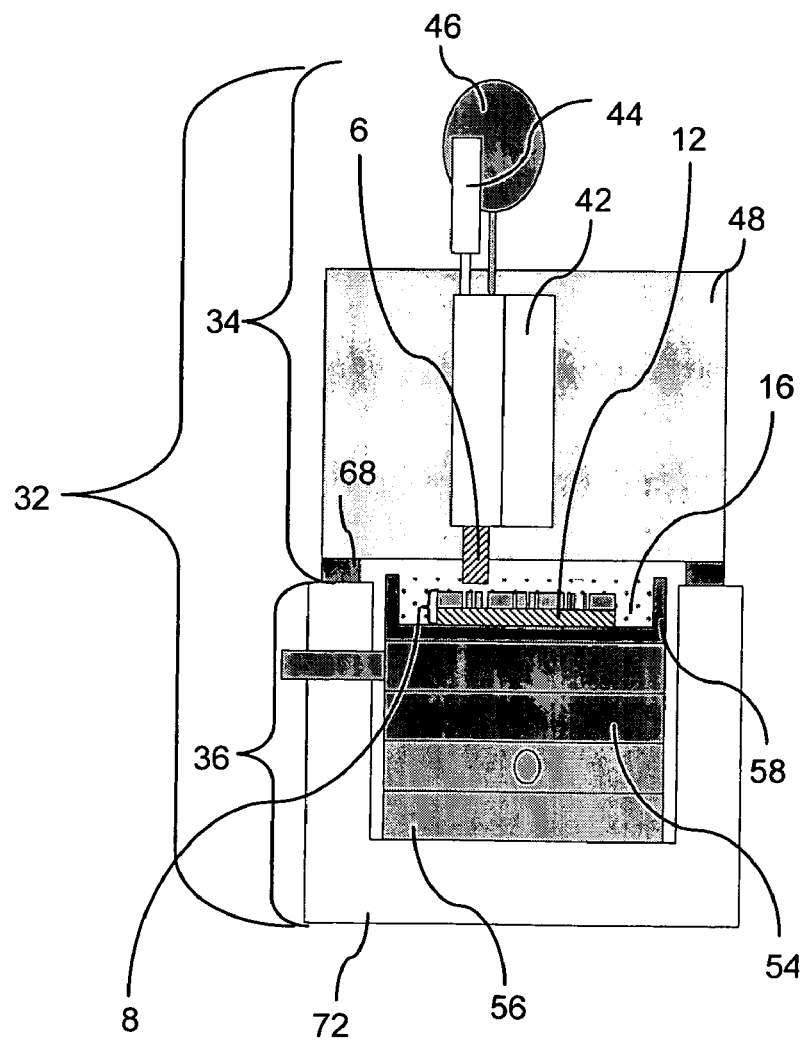
FIGS. 3A–3C schematically depict side views of various example subassemblies that may be used in manually implementing the electrochemical fabrication method depicted in FIGS. 2A–2F.
Figure 3B:
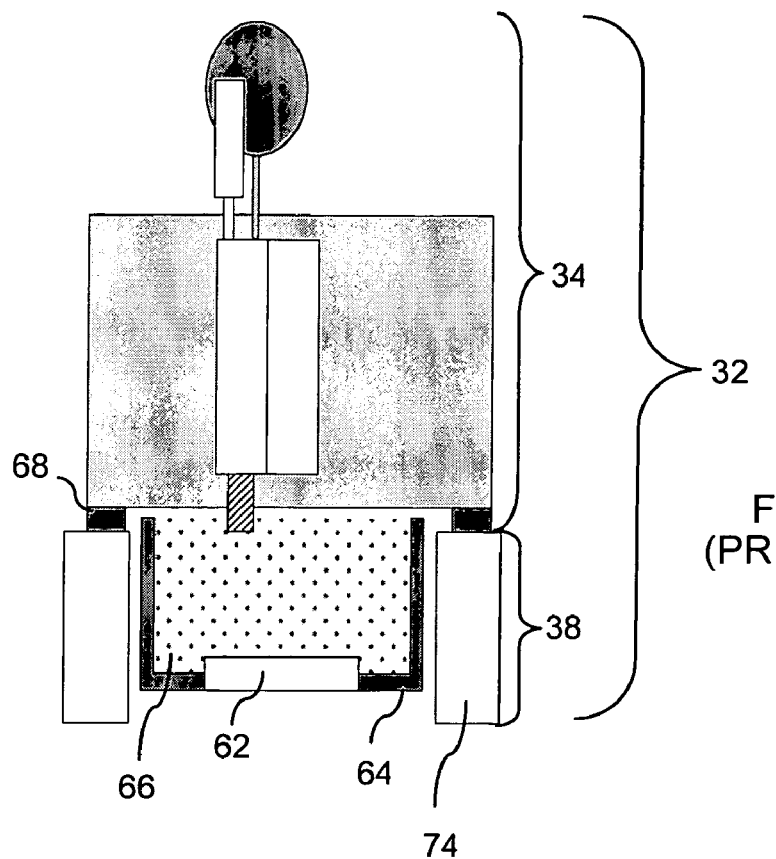
Figure 3C:
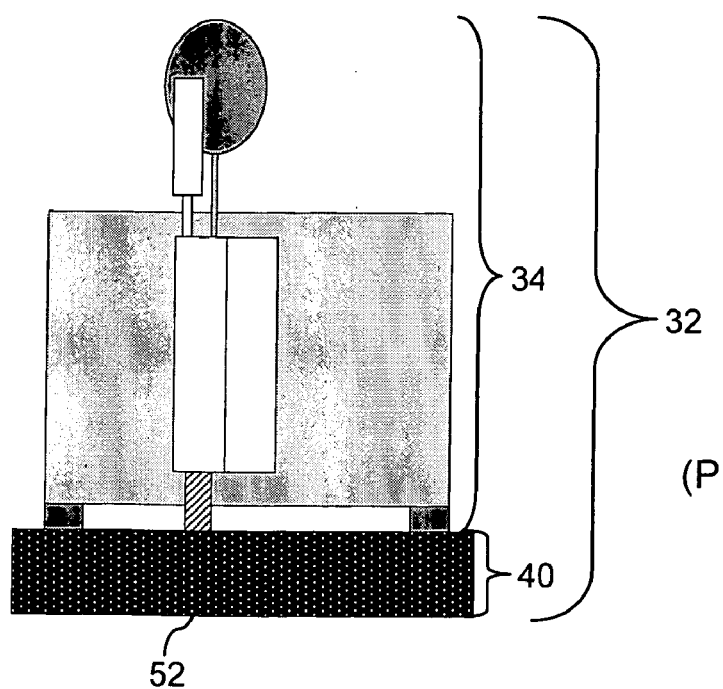
Figure 10C:
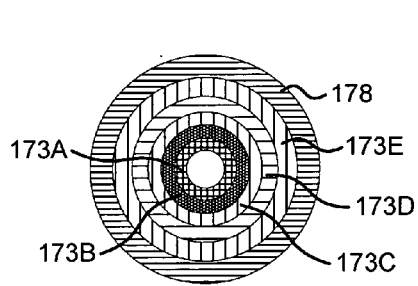
Figure 10D:
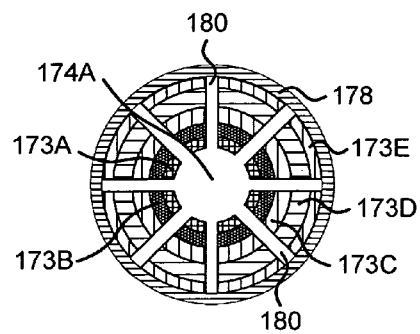
Figure 10E:
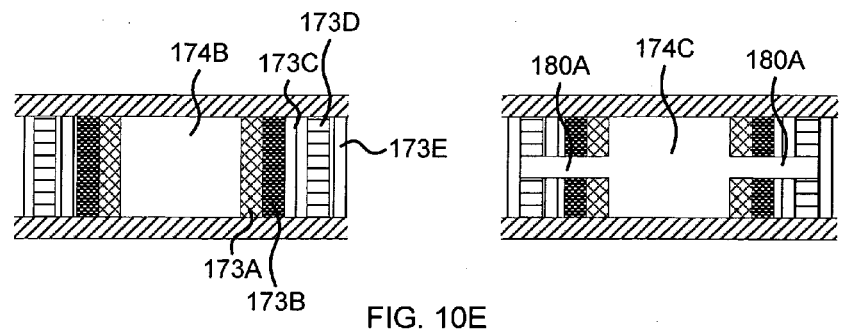

FIG. 1C shows a top view of opening 174 of FIG. 10A when the opening is circular in nature and the stairsteps 173A–173E are circles of progressively varying inner diameter. FIG. 10D depicts a top view of an opening 174A which is an alternative to the opening 174 of FIG. 10A where the opening is indicated to be substantially circular but with radial openings 180 cut through the stairsteps 173A–173E which increases the size of the opening for improved entry of etchant and removal of sacrificial material but still not forming such a large opening that the sealing material 178 would have difficulty bridging the gaps. FIG. 10E depicts top views of two openings 174B and 174C which are analogous to openings 174 and 174A of FIGS. 10C and 10D, respectively. Openings 174B and 174C are rectangular opening as opposed to circular. Though openings 174B and 174C are shown almost as square in shape, in actual practice they may be elongated with slopes on each side of the elongated openings. If elongated, the slots 180-A through the stairsteps 173A–173E may be increased in number.

Figure 10F:
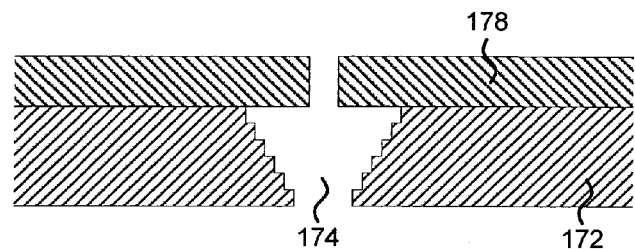
Figure 10G:
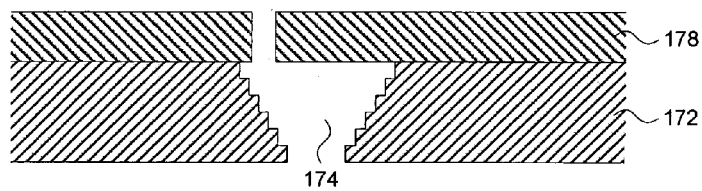
Figure 10H:
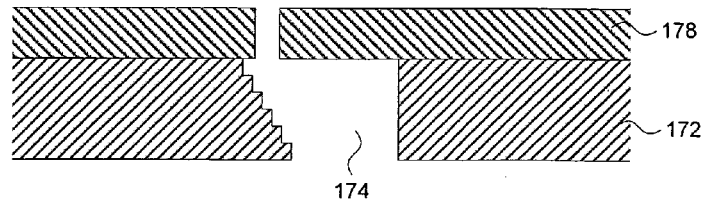
Figure 10I:
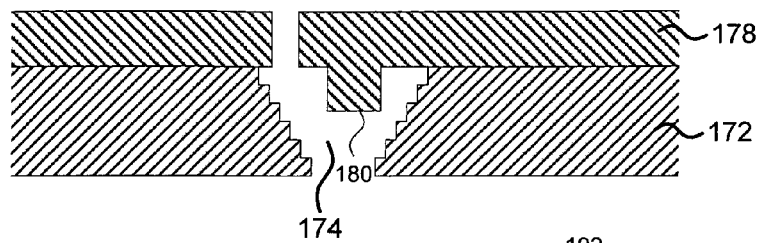

FIG. 10F shows a side view of an alternative configuration for the sealing material 178 in relation to an opening 174 in a portion of an enclosure structure formed of structural material 172. The sealing material extends symmetrically beyond the edges of each side of the upper portion of the opening 174. It is believed that such a configuration will aid in the closure of the hole once the material is made to flow. FIG. 10G depicts a side view of an alternative configuration to that of FIG. 10F in that a portion of the overhanging sealing material is made to extend substantially beyond the midpoint of opening and preferably substantially over the lower portion of the structure bounding the opposite side of the opening such that when the flowable material is heated it may flow and collapse on the far side of the opening and thereby sealing it. FIG. 10H depicts a side view of a further alternative to the configuration of 10F in that the structural material is formed in such away that that the opening through the structural material is non-symmetric and as with FIG. 10G is not centered with the opening in the sealing material 178. FIG. 10I depicts a further alternative where the overhanging portion includes a bulge 180 of sealing material attached thereto. It is believed that this bulge of material will be useful in aiding the closure of the opening once the sealing material is made to flow. In other alternatives, the bulge of material may be extended to largely cover the entire right side of the sloped surface of the opening in structural material 172.

Figure 11A:
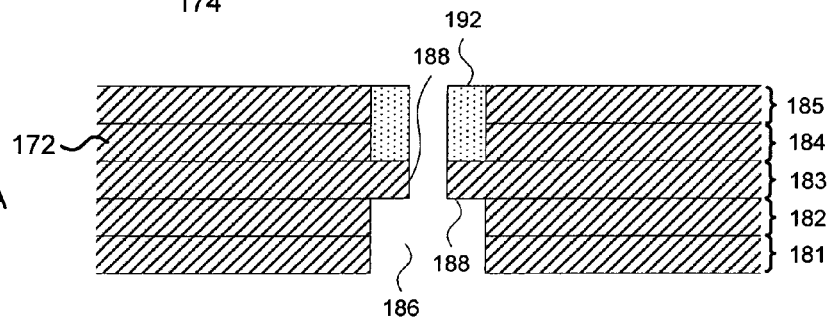
FIGS. 11A–11C depict various alternative opening and sealing configurations.

FIG. 11A depicts five layers 181–185 of structural material 172 forming a portion of an enclosure and having an opening 186 therein. The layers are configured to have a protrusion 188 jutting into the opening. Above the protrusion is a quantity of sealing material 192. Once the sealing material is made flowable it is believed that the protrusion 188 will help force the sealing material to bridge the gap in this narrowed region and will help hold the sealing material in place once contact between the sides is made. In this embodiment as well as in others, it may be particularly useful to treat the enclosure with a reducing gas or other activation process after removing the sacrificial material but before the sealing material is made to flow. The activation of the surface may help in causing the flowable sealing material to wet the surface of the structural material. In particular, if the structural material is subjected to activation, and the activation is initiated from one side of the opening, it may be desirable to have the sealing material toward the opposite side of the opening as it may be anticipated that side nearest the initiation will be more highly activated and thus the flowing material will have a tendency to move in that direction as it wets the surface of the structural material. As such, if the sealing material is toward the inside of the enclosure, and activation is initiated from outside the enclosure, the higher level of activation may be toward the outer extends of the opening and the material will be encouraged to flow in the right direction for sealing the opening.

Figure 11B:
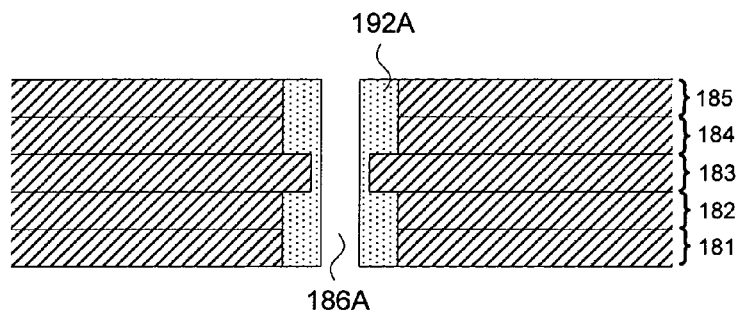
Figure 11C:
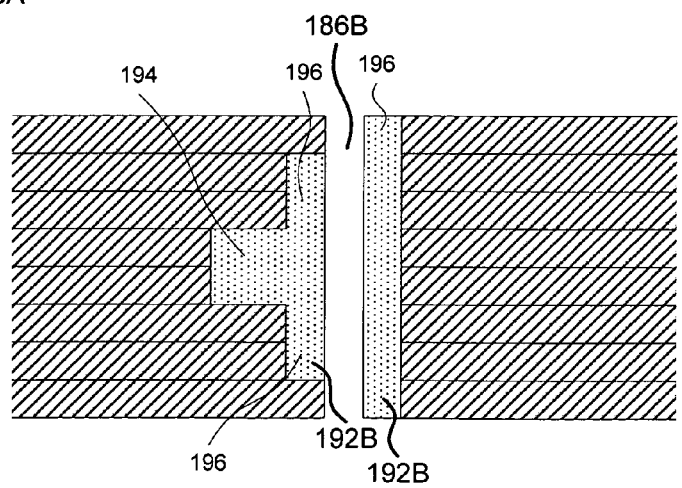

FIG. 11B depicts a side view of an alternative configuration for the sealing material 192A and opening 186A. This alternative configuration may keep the sealing material from having to flow across any unwetted structural material surfaces in that the sealing material is deposited over the protrusions and thus need only internally bulge due to surface tension forces. In embodiments of this type, it may not be necessary or desirable to activate the surfaces of the structural material. FIG. 11C depicts a side view of another alternative configuration of sealing material 192B and opening 186B where a bulge of sealing material 192B is provided within a pocket 194 adjacent to the opening. It is believed that such a pocket of material adjacent to thinner regions 196 of sealing material 192B might tend to draw material from those thinner regions as surface tension drives the sealing material to minimize its surface area thus increasing the bulging of the pocket to help seal the opening.

Figure 12A:
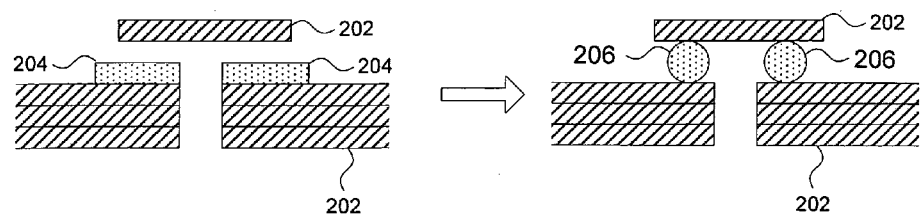
FIGS. 12A–12C depict various alternative opening and sealing configurations.
Figure 12B:
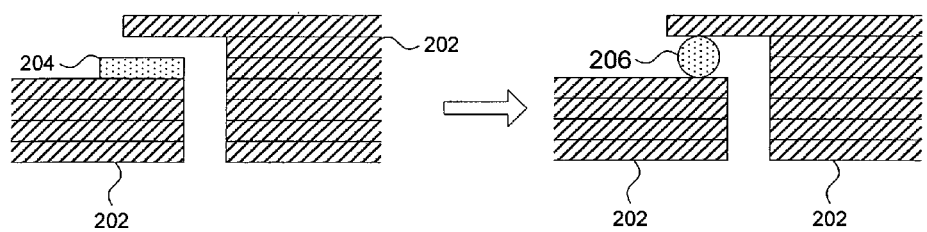
Figure 12C:
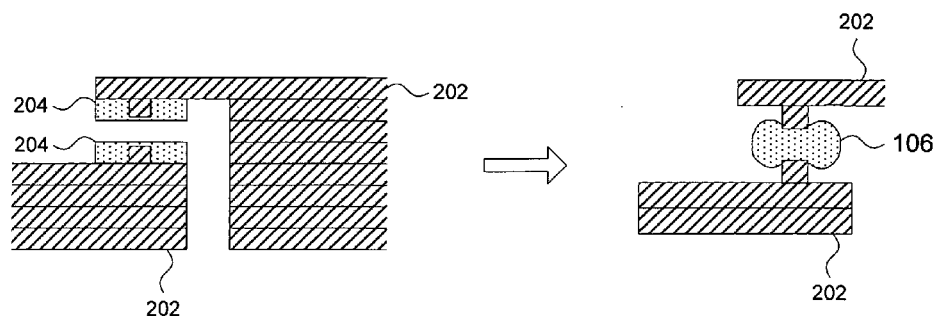

FIGS. 12A–12C depict side views of before and after versions of deposited and flowed sealing material for different potential opening configurations. In these configurations the structural material is given reference numeral 202 and the deposited sealing material is given reference numeral 204 and the flowed sealing material is given reference numeral 206.

FIG. 5B presents the basic steps of a second group of embodiments of the invention in the form of a block diagram. In this Figure like elements to those in FIG. 5A are given like reference numerals. Block 102A, calls for the formation of a group of fabricated layers that include: (1) structural component(s) that are to be protected; (2) a protective enclosure formed from a structural material but having at least one opening therein; and (3) a sacrificial material located at least partially between the component(s) to be protected and the protecting enclosure. Block 102A also indicates that the formed layers may also include a sealing material located near the at least one opening.

After the layers are formed the process proceeds to block 104 which calls for the removal of the sacrificial material. This may be performed in any manner that allows selective removal of the sacrificial material without damaging the structural material (e.g. by selective chemical etching or melting).

Next, at block 106, the process calls for the optional evacuation of the region(s) between the enclosure and the structure to be protected. The process may also include the back filling of the regions with a desired fill gas. The fill gas, for example, may be inert (e.g. $N_2$, Ar, or the like) or it may be chemically active such as providing a reducing environment (e.g. $H_2$). The process may also include some special processing that is useful for preparing the structure/enclosure combination for the next operation.

Next, the process moves forward to block 110 which calls for moving a sealing structure into position relative to the rest of the enclosure. The sealing structure may include a sealing material. Typically at least one of the layers formed or the structure will include a sealing material. One of the enclosure or the sealing structure may also or alternatively include an adhesive. The movement of the sealing structure may be by translation, rotation, or some combination thereof. The movement may occur, for example, by pushing with a structure, by air pressure, by collapse as the sacrificial material is removed, by movement induced by stresses built in during layer-by-layer formation, by causing a phase change or the like to occur that causes a relative motion to result, or the like.

Finally, at block 108A, the sealing material is temporarily made to flow while the enclosure and sealing structure are brought or held together.

Figure 13A:
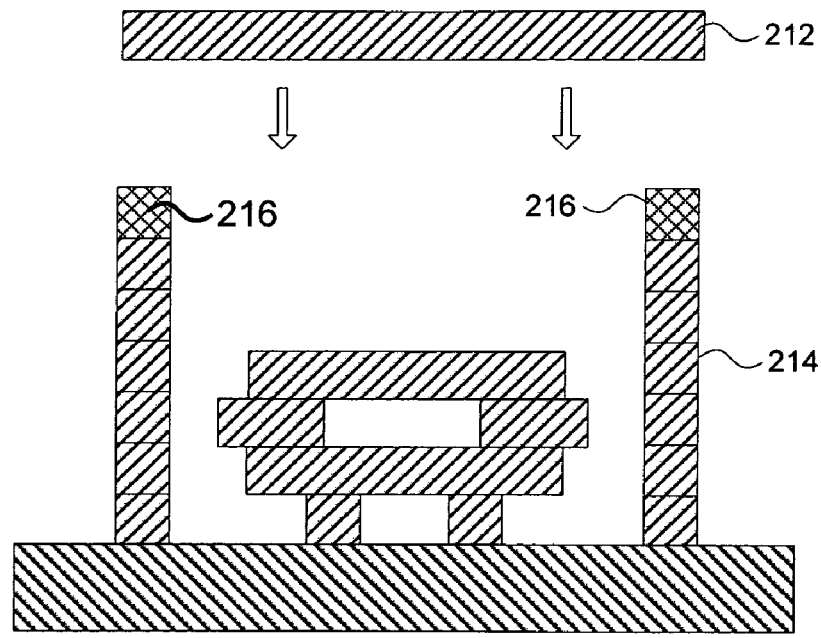
FIGS. 13A and 13B depict an alternative opening and sealing technique
Figure 13B:
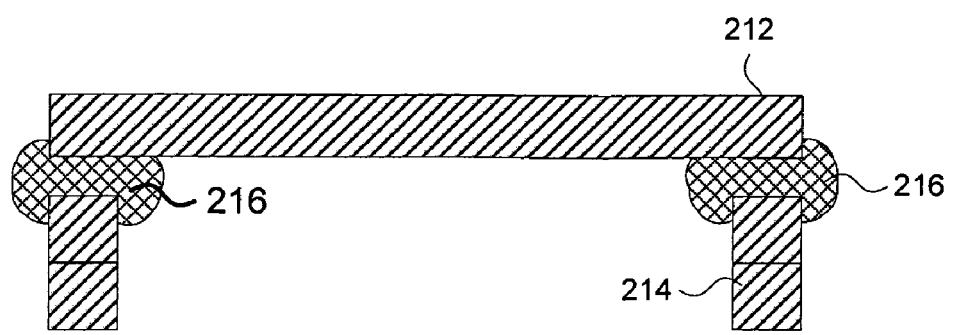

FIGS. 13A and 13B depict an example according to one of the embodiments of the second group of embodiments outlined in FIG. 5B. FIG. 13A depicts a lid 212 located above the walls 214 of an enclosure. The walls are topped with sealing material 216. After removal of any sacrificial material (not shown) the lid is brought down into position and the sealing material 216 is made to flow (e.g. by the lid being heated). The sealing material is compressed and forms seals between the lid and the walls as shown in FIG. 13B. The lid 212 may be made by an electrochemical fabrication process or be made in some other manner. The lid may be of a different material than the rest of the enclosure. The lid may be a dielectric or even a transparent material.

In some embodiments, like that shown in FIGS. 13A and 13B the walls of the enclosure are co-fabricated with the structure but the lid is not. The walls may or may not have etching holes in them. The last layer of the structure formed may have a sealant applied (e.g. some type of solder) which may or may not be planarized. After etching to release the structure in the box, the separately fabricated lid (e.g. a metal sheet of some kind) is placed over the build. This may be done at the wafer scale or on individual devices. The solder (or other sealing material) is made to flow and the device is sealed. This approach offers several advantages: (1) the devices or structures can be easily, visually examined prior to sealing; (2) additional processing (e.g., metallization, passivation, testing, etc.) may be performed prior to sealing; (3) release etching will be less problematic; (4) problems with the application or planarization of the flowable material may be minimized; (5) it may be cheaper since one or more EFAB produced layers can be eliminated by use of an essentially unpatterned sheet, (6) the lid may be made of a material that is not easily electrodeposited; and (7) wetting of the wall surfaces and lid surface by the solder become less critical as a result of being able to press the lid and the wall surfaces together.

In some alternative embodiments, the solder (or other flowable sealing material) may be deposited onto the lid as opposed to on the walls.

Many alternatives to the above noted embodiments are possible and many additional embodiments will be apparent to those of skill in the art. Multiple structural materials may be used. Multiple types of flowable materials may be used. Structural component(s) and enclosures may be formed from different materials or even multiple materials. One or more of the flowable materials may be used for sealing while others may be used for causing displacement of structures relative to one another and thus may aid in the automatic sealing of structures after removal of any sacrificial materials. Interconnects may be fed through the enclosures or the substrate so that electric connection to the structure inside the enclosure can be established. Lid structures or substrates may have openings covered by transparent windows such that optical components may be embedded inside the enclosures and optical signals transmitted into and out of the enclosures. The substrate may include a conductively coated transparent structure (e.g. glass) where the coating may be removed in conjunction with the removal of the sacrificial material or be removed subsequent to the removal of the sacrificial material. Alternatively, a sufficiently conductive and optically transmitive coating may be applied to a transparent substrate such as glass, quartz, and the like.

Various techniques may be used to improve and supplement the processes described above.

IR reflow may be used to make heating more uniform and to minimize the heating of the structures or components to be protected (e.g. devices) and the substrate. In this process an IR source larger than the substrate is placed parallel to the solder layer and at a fixed distance. The substrate can be relatively translated in a direction perpendicular to the plane of the layers (i.e. along the z-axis if the surfaces of the layers are parallel to the X-Y plane) to bring it into proximity with the IR source or it can be moved on a conveyor past the source or it can be fixed in place before heat is applied.

An alternative heating approach involves the use of a hot plate. In this approach, the solder layer or lid of structural material contacting the solder is brought into actual contact with a hot plate. The plate could be treated to improve the wetting of the solder. The hot plate may be brought into contact by translation along the z-axis, and may be removed by lateral translation. In a more extreme case, the hot plate could carry the solder and the packaging layer would not have to be plated with solder. In an alternative to the use of the hot plate it may be possible to bring the layer with openings into contact with molten sealing material (e.g. solder that has been made molten) which will wet and cling to the surface when the surface is moved away and will seal the opening(s).

Various surface treatments may be used to improve the wetting of the sealing material (e.g. solder) to the structural material. Chemical treatments may be used such as fluxes, resins, surface activators. It is also possible for Electrochemical and plasma treatments to be used. It may be possible to add surface treatment chemicals to the etchant that is used to remove the sacrificial material.

Reduction processes may be used to reduce oxide layers that can impede the flow of the sealing material and thus may improve wetting. As an implementation example, before a sealing material is made to flow, a reducing atmosphere (e.g., hydrogen) is provided. The sealing material may be held below its melting point until oxide layers are fully reduced. The reducing atmosphere may then be replaced with an inert gas (e.g. $N_2$). The inert gas may then be evacuated to create an evacuated space or it may be retained. While the enclosure remains evacuated or filled with a desired gas, the temperature may be increased to the reflow temperature or to desired temperature above the reflow temperature such that flow of the sealing material results in sealing after which the temperature may be reduced to allow solidification of the molten sealing material.

In some embodiments wicking structures may be used to aid in the flow of sealing material. Ideally, openings should be sized and located to give the maximum area for etchant flow, but provide the minimum challenge for wetting with sealing material. Circular openings may not be optimal and long narrow openings (slots) or star shapes may be better, but still other alternatives may exist. Circular opening can be made more likely to occlude (i.e. seal) by adding wetting structures. A simple wetting structure is a line that bisects the opening as was illustrated in FIG. 7A. The line may be in either the structural material or the sealing material or in both (e.g. adjacent to one another). The line may arch out of the planes of the layers or otherwise be of a non-linear shape (e.g. curved or of varying dimension). A more complex wetting structure may have one or more concentric rings connected by one or more sets of lines (e.g. two sets of bisecting lines).

Figure 14A:
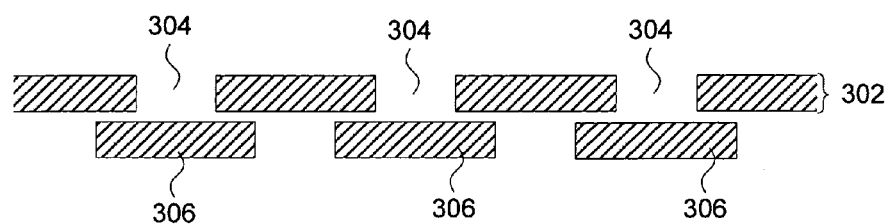
FIGS. 14A and 14B depict an alternative technique for sealing openings.
Figure 14B:
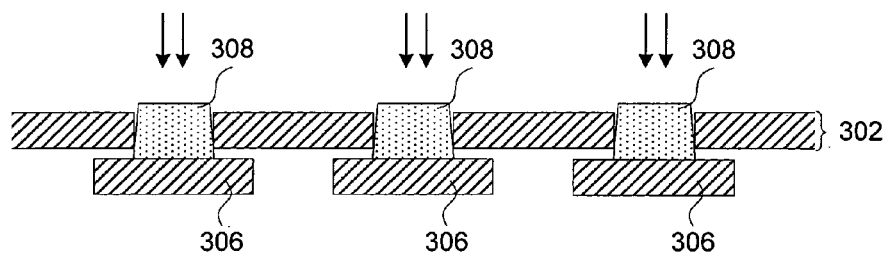

In still other embodiments, it may be possible to perform a deposition to fill the holes, particularly if such a deposition is essentially a straight line deposition process and if underneath the holes a structural element is located that can act as a deposition stop and build up surface from which the deposit can build up to seal the openings. This is illustrated with the aid of FIGS. 14A and 14B. FIG. 14A depicts a wall or lid of a packaging structure 302 below which a component to be sealed exists (not shown). The wall or lid contains openings 304 below which blocking elements 306 exist. Any sacrificial material located below the wall or lid 302 is removed, at least in part, via openings 304. After removal, the package may be filled with a desired gas or other material or it may remain evacuated. A substantially or at least largely straight line deposition process (e.g. via PVD) may be used to deposit sufficient material into the holes such the holes become sealed. Such sealing is illustrated in FIG. 14B via the deposition of material 308. In FIG. 14B the deposition of material 308 is indicated as being selectively applied. In other alternatives, the material may be deposited in a blanket fashion.

In other embodiments, to enhance the hermetic sealing of a solder-type sealer, it may be possible to perform a PVD or other deposition operation over the sealed openings to deposit a material that tends to be more hermetic in its properties (e.g. metal or glass). In still other embodiments it may be possible to perform an electrodeposition operation over the solder sealed openings to enhance the sealing. In other embodiments, a sealed package may include a getter material.

Figure 15A:
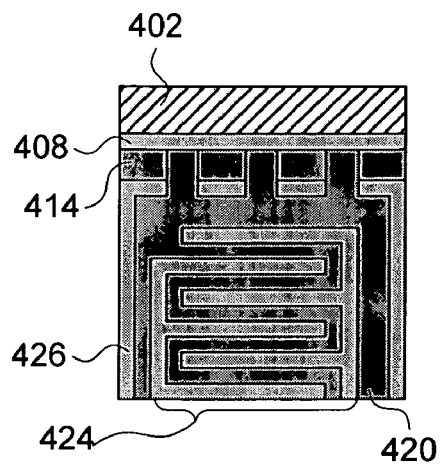
FIGS. 15A–15F depict side views of various states of an alternative embodiment for packaging a structure.
Figure 15B:
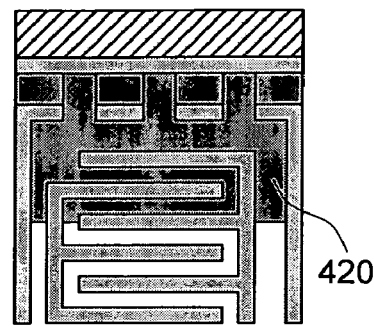

Another embodiment is explained with the aid of FIGS. 15A–15F. In FIG. 15A, a device 424 (e.g., a capacitor as shown here) has been fabricated, top layer first, on a metallic release layer 408 (e.g., low-melting point solder) applied to a temporary substrate 402. In FIG. 15B, prior to attachment of the final substrate, the sacrificial material 420 has been partly etched. As much etching is done as is possible at this time, though preferably not so much as to completely release the device 424 inside the package 426, since the device as a whole and its individual components or structures may then shift from their intended positions. To allow for prolonged etching, each independent element of the device may be provided with an anchoring segment (not shown or required in this example) which extends upwards so that it is embedded within the sacrificial material during this initial etch, if the element otherwise (e.g., due to its relatively short height) would become unanchored. In embodiments where structures are otherwise joined to the side walls complete etching may be acceptable.

Figure 15C:
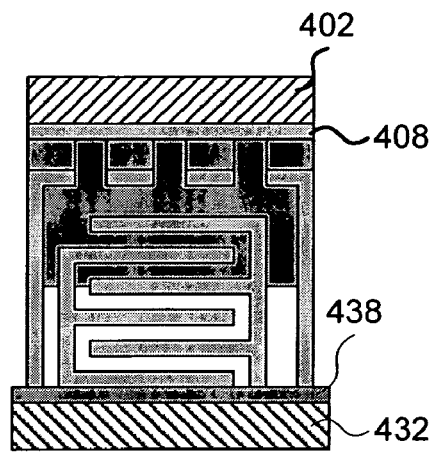

In FIG. 15C, the device 424 and enclosure 426 have been adhered to a final substrate 432 that is coated with an adhesive layer 438 (unless the substrate is made from a thermoplastic or other material which can itself adhere to the structural material). The adhesive is preferably of a type that allows for a hermetic or near-hermetic seal to be achieved, and preferably has good adhesion to the structural material.

Figure 15D:
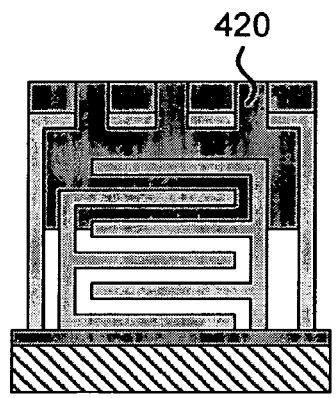
Figure 15E:
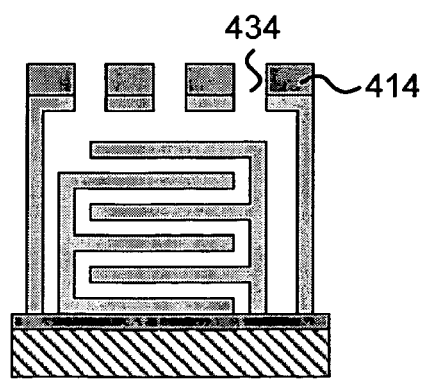
Figure 15F:
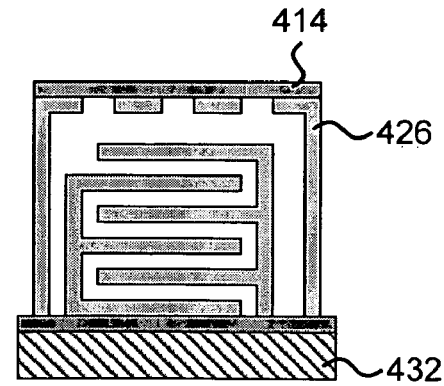

In FIG. 15D, the release layer is shown as having been removed (e.g., by melting if a solder) and the temporary substrate is shown as having been removed (if necessary, any residue of the release layer can be removed by etching, lapping, polishing, etc.). In FIG. 15E, the remaining sacrificial material 420 is shown has having been removed through holes 434 in the package 426. In FIG. 15F, the solder 414 (typically with a higher melting point than the solder used for the release layer) is melted to seal the device (this step may be performed within a heated chamber filled with the desired gas or within a vacuum chamber).

Figure 16A:
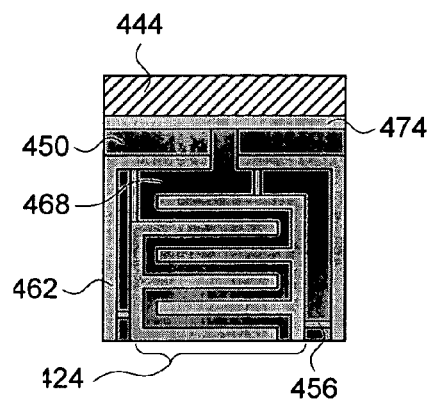
FIGS. 16A–16E depict side views of various states of another embodiment for packaging a structure.
Figure 16B:
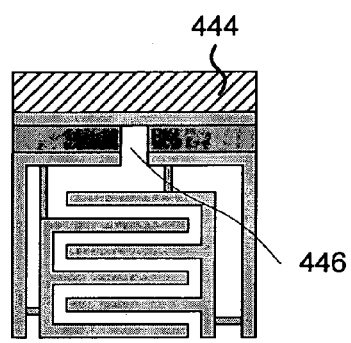
Figure 16C:
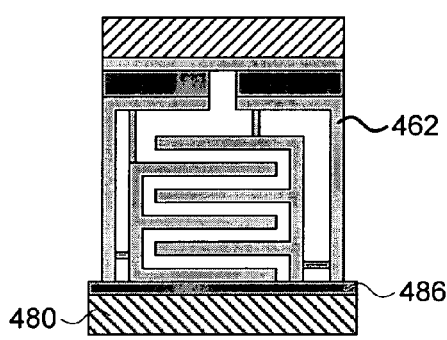
Figure 16D:
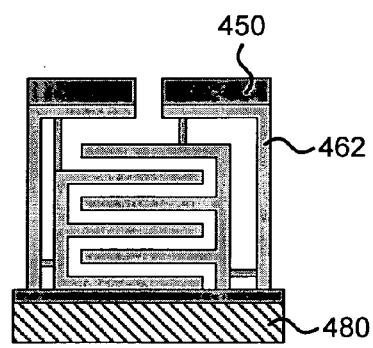
Figure 16E:
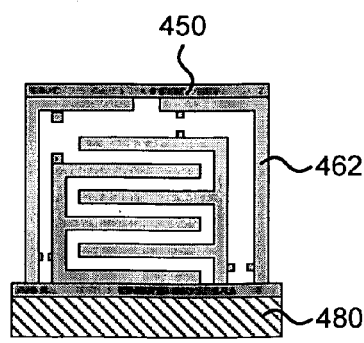

Another embodiment is illustrated in FIGS. 16A–16F. In this embodiment, individual isolated elements of the structure, component, device, or the like (424) are anchored to other elements and the inside surfaces of the package or enclosure so as to allow complete etching of the sacrificial material while otherwise isolated elements retain their positions. Only a single small hole is required to be sealed by solder (in some alternative embodiments multiple holes may be supplied), and this hole, along with the adjacent solder, is not required if the interior of the package or enclosure can be air at atmospheric pressure (vs. an inert gas or a vacuum, for example), or if the operation of attaching the structure and enclosure to the final substrate can be accomplished while in an environment of a desired gas or a vacuum. The only remaining purpose for the hole and sealing solder is to allow a desired internal atmosphere for the package to be created after 'substrate swapping' is completed. In FIG. 16A, a device 424 along with a package or enclosure 462 and sacrificial material 462 have been fabricated, top layer first, on a metallic release layer 474 (e.g., low-melting point solder) applied to a temporary substrate 444. High-aspect ratio 'pillars' 456 of high-melting point solder (in fact, a low-melting point solder can also be used, in which case the pillars will detach during the step leading to the state depicted in FIG. 16D, vs. during a separation operation depicted as being completed in FIG. 16E) have been provided to anchor the individual elements of the device during the subsequent etch. In FIG. 16B, prior to attachment of the final substrate 480, the sacrificial material 468 has been completely removed via etching. In FIG. 16C, the structure has been adhered to a final substrate that is coated with an adhesive layer 486. In FIG. 16D, the release layer 474 is shown as being removed or otherwise being made to release its grip on temporary substrate 444 and the temporary substrate is shown as being removed. In FIG. 16E, the higher-melting point solder forming pillars 456 and sealing layer 450 is melted to seal the device and to cause the pillars to 'ball up' since they become unstable when melted due to their high aspect ratio (length/diameter).

Another group of embodiments provide an enclosure with moveable attached sealing structures (e.g. lids). In these embodiments the sealing structure is initially located to allow etching and is then moved or dropped into sealing position. The attachment of the sealing structure to the enclosure allows the lid to remain attached to the enclosure during etching and possibly to thereafter be positioned with enhanced alignment. In some embodiments, the attachment elements may be supplemented by one or more alignment elements. In some embodiments, these attachment and/or alignment elements may be located on the perimeter of the enclosure and/or sealing structure. In some alternative embodiments, they may be located to the interior of the perimeter of the enclosure or sealing structure.

In some embodiments, movement of the sealing structure relative to the enclosure may cause alignment or attachment elements to progress further into the interior of the enclosure thereby necessitating existence of sufficient clearance between the elements and the structure (device) to be packaged. In some alternatives the alignment and/or attachment elements may be mounted on the enclosure itself and thereby not cause a shrinking of the interior space of the enclosure as sealing occurs.

Figure 17A:
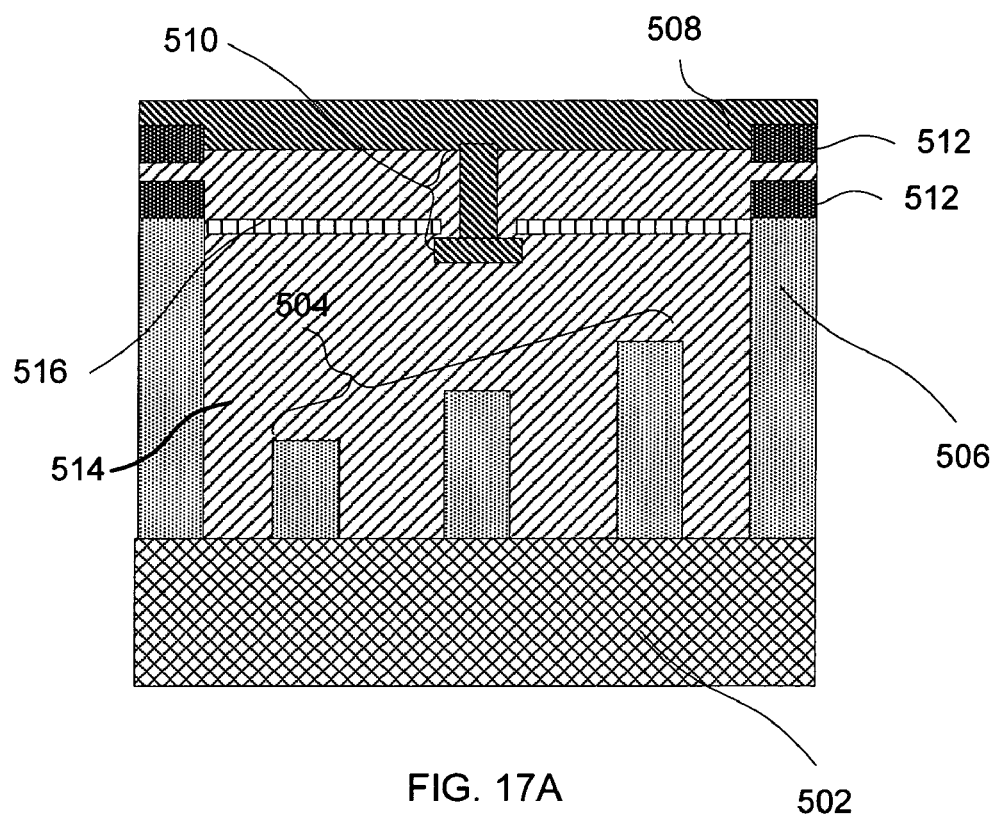
FIGS. 17A and 17B depict side views associated with an alternative configuration for removing sacrificial material and for sealing a package.
Figure 17B:
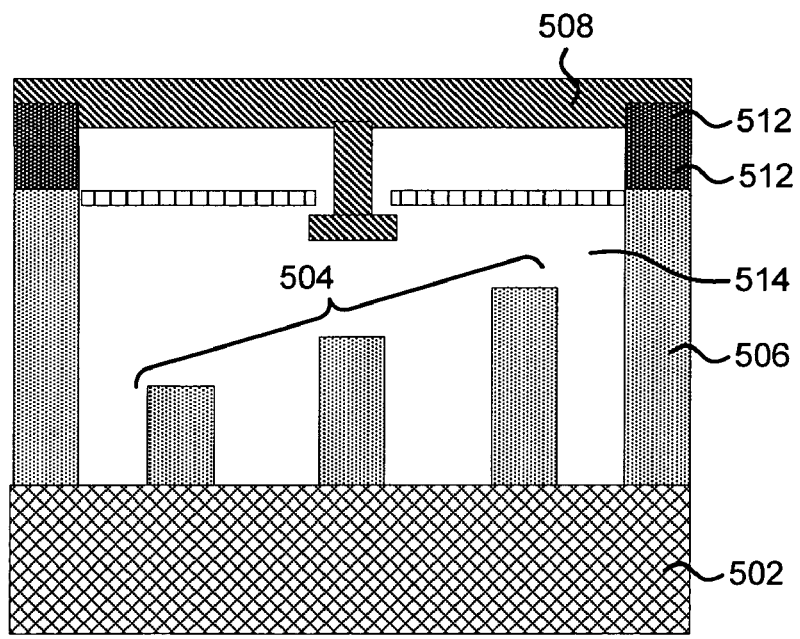

An example of a structure 504 configured and packaged according to this group of embodiments is depicted in FIGS. 17A and 17B which schematically depict side views of a package and structure in a pre-sealed state and a sealed state. FIG. 17A depicts a sealing structure or lid element 508 having an attachment element 510. The lid element 508 is spaced from the walls of an enclosure 506 which is mounted to a substrate 502 which together define an interior region 514 in which a structure 504 is located. The attachment element 510 protrudes through an opening in a retention structure 516 which forms part of enclosure 506. Lid 508 and/or enclosure 506 (both as depicted) include a sealing material 512 (e.g. solder or a sealable adhesive). FIG. 17B depicts the enclosure and lid after they have been mated. The sealing material may then be melted or otherwise made to seal the enclosure.

In the depicted example, the flow passages for etching the structure are located along the perimeter of the enclosure. This may be acceptable in some embodiments, but if the enclosure is relatively wide, access of etchant only from the edges or perimeter of the structure may cause problems (e.g. slow etching time, damage to the perimeter of the structure as a result of over exposure to etchant, and the like). In other embodiments, other passage and sealing configurations are possible (e.g. in which passages are supplied throughout the interior portions of the lid).

The structure and enclosure are preferably upside down during etching of the sacrificial material (e.g. copper) or are otherwise subjected to different orientations. When all the sacrificial material is etched, the lid is free to move and the structure and enclosure are dried and may be laid right side up so the lid "falls" into a seated position on top of a thin plated solder layer as shown in FIG. 17B. Next the package is heated to form a solder weld between lid and enclosure to complete the packaging. As depicted, both the lid and the enclosure could have perimeters of solder plating so wetting of structural material is not necessary.

Figure 18A:
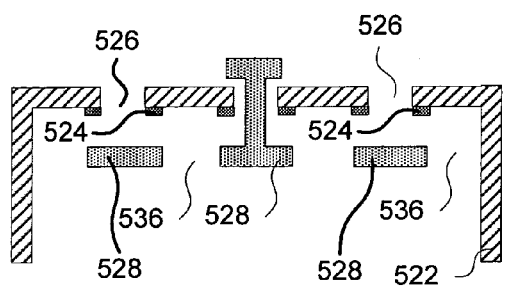
FIGS. 18A–18B depict side views for an alternative configuration for removing sacrificial material and for sealing a package.
Figure 18B:
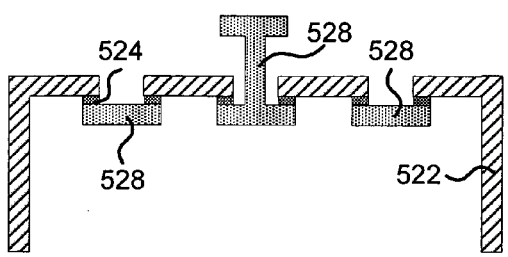
Figure 18C:
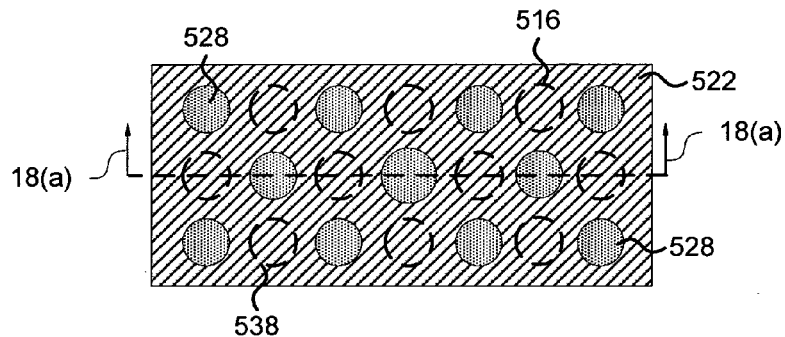
FIG. 18C depicts a top view of the enclosure and lid of FIG. 18A

FIGS. 18A–18D depict other alternative configurations that may have utility in sealing enclosures. As noted above etching holes located within the interior of a lid or enclosure can be useful in decreasing time to etch and in some configurations such holes need not be limited to a size that can be sealed by a filling solder. FIG. 18A depicts an enclosure 522 having sealing material 524 located near openings that extend through holes 526. Moveably attached to the enclosure is lid element 528 that is formed in a lower position and can be moved higher once etching has been completed and it is desired to seal the structure. The lid element 528 includes openings 536 that extend through it and are offset slightly from the holes 526 in enclosure 522. FIG. 18B depicts the enclosure and lid when relatively positioned to yield a closed state at which point sealing can occur. FIG. 18C shows a top view of the structure of FIG. 18A wherein lid element 528 can be seen through the holes 526 that extend through enclosure 522. Dashed lines 538 show the boundaries of holes 536 in lid 528.

Figure 18D:
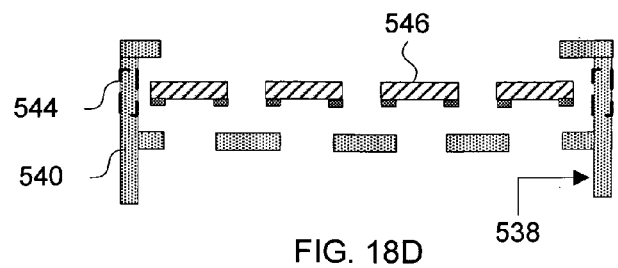
FIG. 18D depicts a side view for an alternative configuration for removing sacrificial material and for sealing a package.

FIG. 18D shows an alternative configuration where the attachment structures are located on the perimeter of the enclosure 538 and where enclosure portions 540 form a groove with a lip to retain lid 546), may include openings 544 that can aid in providing access for etchant.

In some alternative embodiments the packaging techniques disclosed herein may be implemented without necessarily hermetically sealing the structure within the enclosure.

In some alternative embodiments solder may be deposited or formed in ways that minimize or even eliminate the need for it to be planarized (e.g. possibly by selective deposition to heights lower than the next planarization level or by deposition into voids, etc.).

In other alternative embodiments, the lids need not be planar or featureless, the lids (i.e. the other half of the enclosure) may contain structural components that have been electrochemically fabricated or that have been produced in some other manner.

In other alternative embodiments, a lid may be placed over an enclosure after etching away the sacrificial material and the lid may be covered (particularly in the bridging region from the lid to the enclosure) with an epoxy or other material to complete the sealing operation. In other embodiments, the lid may be matted to the enclosure via a tapered surface. In still other embodiments the solder, other meltable materials, adhesive, and the like may be used in establishing a preliminary bond or seal between the enclosure and the lid while an over coating with an epoxy, or other material (e.g. electrodeposited, sputtered, or metal applied in some other way) may be used to enhance the integrity of the packaging.

The patent applications set forth below are hereby incorporated by reference herein as if set forth in full. The gist of each patent application is included to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, and entitled "An Apparatus for Electrochemical Fabrication Comprising A Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. Patent Application No. 60/415,374, filed on Oct. 1, 2002, and entitled "Monolithic Structures Including Alignment and/or Retention Fixtures for Accepting Components" is generally directed to permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. Patent Application No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. Patent Application No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. Patent Application No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thickens. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multi-layer operations of EFAB™.

U.S. Patent Application No. 60/435,324, filed on Dec. 20, 2002, and entitled "EFAB Methods and Apparatus Including Spray Metal or Powder Coating Processes", is generally directed to techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. Patent Application No. 60/429,483, filed on Nov. 26, 2002, and entitled "Multi-cell Masks and Methods and Apparatus for Using Such Masks to Form Three-Dimensional Structures" is generally directed to multilayer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibiting significant deposition or etching.

U.S. Patent Application No. 60/429,484, filed on Nov. 26, 2002, and entitled "Non-Conformable Masks and Methods and Apparatus for Forming Three-Dimensional Structures" is generally directed to electrochemical fabrication used to form multilayer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate whereafter the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. Patent Application No. 60/468,977, filed on May 7, 2003, and entitled "Method for Fabricating Three-Dimensional Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,289 filed on May 7, 2003, and entitled "Conformable Contact Masking Methods and Apparatus Utilizing In Situ Cathodic Activation of a Substrate" is generally directed to an electroplating processes (e.g. conformable contact mask plating and electrochemical fabrication processes) that includes in situ activation of a surface onto which a deposit will be made. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral With Semiconductor Based Circuitry" is generally directed to an enhanced electrochemical fabrication processes that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,315, filed on May 7, 2003, and entitled "Methods of and Apparatus for Molding Structures Using Sacrificial Metal Patterns" is generally directed to molded structures, methods of and apparatus for producing the molded structures. At least a portion of the surface features for the molds are formed from multilayer electrochemically fabricated structures (e.g. fabricated by the EFAB™ formation process), and typically contain features having resolutions within the 1 to 100 µm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

U.S. patent application Ser. No. 10/434,493, filed on May 7, 2003, and entitled "Electrochemically Fabricated Structures Having Dielectric or Active Bases and Methods of and Apparatus for Producing Such Structures" is generally directed to multilayer structures that are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are form from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multilayer structure may be released from a sacrificial material prior to attaching the permanent substrate or it may be released after attachment.

U.S. patent application Ser. No. 10/434,497, filed on May 7, 2003, and entitled "Multistep Release Method for Electrochemically Fabricated Structures" is generally directed to multilayer structures that are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

U.S. patent application Ser. No. 10/434,519, filed on May 7, 2003, and entitled "Methods of and Apparatus for Electrochemically Fabricating Structures Via Interlaced Layers or Via Selective Etching and Filling of Voids" is generally directed to multi-layer structures that are electrochemically fabricated by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in: patterns; numbers or existence of or parameters associated with depositions, etchings, and or planarization operations; the order of operations, or the materials deposited). Other embodiments form multi-layer structures using operations that interlace material deposited in association with some layers with material deposited in association with other layers.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes that are not contact masking processes and are not even electrodeposition processes. Some embodiments may use nickel as a structural material while other embodiments may use different materials such as gold, silver, or any other electrodepositable materials that can be separated from the copper and/or some other sacrificial material. Some embodiments may use copper as the structural material. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the invention will be apparent to those of skill in the art. As such, it is not intended that the invention be limited to the particular illustrative embodiments, alternatives, and uses described above but instead that it be solely limited by the claims presented hereafter.

We claim:

1. An electrochemical fabrication process for producing a three-dimensional structure, comprising a structural component and an enclosure, from a plurality of adhered layers, the process comprising:
   (A) depositing at least a portion of a first layer onto a substrate, wherein the substrate may comprise previously deposited material; and
   (B) forming a plurality of layers such that a second layer is formed on the first layer and such that each successive layer is formed adjacent to and adhered to a previously formed layer, and wherein the formation of at least some of the plurality of layers comprises an electrochemical deposition or electrochemical etching operation;
   wherein the plurality of layers comprise at least three different materials and wherein the layers contain patterns of the at least three different materials comprising:
      (1) a desired structural component that is to be protected and that is formed from at least one structural material;
      (2) a protective enclosure that is formed at least in part from a structural material, wherein at least one portion of the enclosure at least partially surrounds the desired structural component, and wherein the enclosure is limited by at least one opening therein;
      (3) a sealing material located near the at least one opening; and
      (4) a sacrificial material located at least partially between the desired structural component to be protected and the at least a portion of the enclosure;
   wherein after formation of the layers at least a portion of the sacrificial material located between the desired structural component and the at least a portion of the enclosure is removed; and
   wherein after the removal of the sacrificial material, the sealing material is made to temporarily flow and seal the at least one opening to block or significantly limit a passage of material from an outside of the enclosure to an inside of the enclosure via the at least one sealed opening.

2. The process of claim 1 wherein the removal of the sacrificial material comprises an etching operation.

3. The process of claim 1 wherein after removal of the sacrificial material and prior to sealing, a reducing agent is provided to at least one location within or near the at least one opening to reduce the presence of any oxides at the at least one location.

4. The process of claim 1 wherein after removal of the sacrificial material and prior to sealing, a desired fill gas is made to fill an interior cavity of the enclosure in which the desired structural component is at least partially located.

5. The process of claim 1 wherein after removal of the sacrificial material and prior to sealing, an interior cavity of the enclosure in which the desired structural component is at least partially located is at least partially evacuated.

6. The process of claim 1 wherein the at least one opening and the sealing material are located so that the sealing material need not flow over any structural material when flowing to seal the opening.

7. The process of claim 1 wherein the at least one opening is sealed at least in part by a surface tension of the sealing material when made flowable causing the sealing material to bulge and bridge the opening.

8. The process of claim 1 wherein the at least one opening has sloped walls that give the opening a non-fixed cross-sectional dimension through the enclosure, the sealing material, or a combination of the sealing material and the enclosure.

9. The process of claim 1 wherein the at least one opening has a restriction around which the sealing material will flow when sealing the opening.

10. An electrochemical fabrication process for producing a three-dimensional structure, comprising a structural component and an enclosure, from a plurality of adhered layers, the process comprising:
   (A) depositing at least a portion of a first layer onto a substrate, wherein the substrate may comprise previously deposited material; and
   (B) forming a plurality of layers such that a second layer is formed on the first layer and such that each successive layer is formed adjacent to and adhered to a previously formed layer, and wherein the formation of at least some of the plurality of layers comprises an electrochemical deposition or electrochemical etching operation;
   wherein the layers comprise at least two different materials and wherein the layers contain patterns of the at least two different materials comprising:
      (1) a desired structural component that is to be protected and that is formed from at least one structural material;
      (2) a protective enclosure that is formed at least in part from a structural material, wherein at least a portion of the enclosure at least partially surrounds the desired structural component, and wherein the enclosure is limited by at least one opening therein;
      (3) at least one blocking structure located along a line of sight that includes the at least one opening but spaced from the protective enclosure; and
      (4) a sacrificial material located at least partially between the desired structural component to be protected and the at least a portion of the enclosure;
   wherein after formation of the layers at least a portion of the sacrificial material located between the desired structural component and the at least a portion of the enclosure is removed; and
   wherein after the removal of the sacrificial material, a sealing material is deposited such that it strikes said blocking structure which inhibits the sealing material from entering the enclosure in bulk, whereby continued build up of the sealing material seals the at least one opening to block or significantly limit a passage of material from an outside of the enclosure to an inside of the enclosure via the at least one sealed opening.

11. An electrochemical fabrication process for producing a three-dimensional structure, comprising a structural component and an enclosure, from a plurality of adhered layers, the process comprising:
   (A) depositing at least a portion of a first layer onto a substrate, wherein the substrate may comprise previously deposited material; and
   (B) forming a plurality of layers such that a second layer is formed on the first layer and such that each successive layer is formed adjacent to and adhered to a previously formed layer, and wherein the formation of at least some of the plurality of layers comprises an electrochemical deposition or electrochemical etching operation and further comprising a planarization operation for setting a uniform height of one or more deposited materials;
   wherein the plurality of layers comprise at least two different materials and wherein the layers contain patterns of the at least two different materials comprising:
   (1) a desired structural component that is to be protected and that is formed from at least one structural material;
   (2) a protective enclosure that is formed at least in part from a structural material, wherein at least a portion of the enclosure at least partially surrounds the desired structural component, and wherein the enclosure is limited by at least one opening therein; and
   (3) a sacrificial material located at least partially between the desired structural component to be protected and the at least a portion of the enclosure;
   wherein after formation of the layers at least a portion of the sacrificial material located between the desired structural component and the at least a portion of the enclosure is removed; and
   wherein after the removal of the sacrificial material, a seal is formed to close the at least one opening to block or significantly limit a passage of material from an outside of the enclosure to an inside of the enclosure via the at least one closed opening.

* * * * *